(12) United States Patent
Anderson et al.

(10) Patent No.: US 7,960,836 B2
(45) Date of Patent: Jun. 14, 2011

(54) REDUNDANT MICRO-LOOP STRUCTURE FOR USE IN AN INTEGRATED CIRCUIT PHYSICAL DESIGN PROCESS AND METHOD OF FORMING THE SAME

(75) Inventors: Brent A. Anderson, Jericho, VT (US); Jeanne P. Bickford, Essex Junction, VT (US); Markus Buehler, Sindelfingen (DE); Jason D. Hibbeler, Williston, VT (US); Juergen Koehl, Weil im Schoenbuch (DE); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 595 days.

(21) Appl. No.: 12/045,374

(22) Filed: Mar. 10, 2008

(65) Prior Publication Data
US 2008/0150149 A1   Jun. 26, 2008

Related U.S. Application Data

(63) Continuation of application No. 11/552,225, filed on Oct. 24, 2006.

(51) Int. Cl.
*H01L 23/52* (2006.01)
(52) U.S. Cl. .................. 257/773; 257/E23.141
(58) Field of Classification Search .................. 257/773, 257/E23.141, E23.151
See application file for complete search history.

(56) References Cited

U.S. PATENT DOCUMENTS
2003/0067075 A1 * 4/2003 Fukasawa ...................... 257/758

OTHER PUBLICATIONS

Bickford et al.; Yield Improvement by Local Wiring Redundancy; IEEE Computer Society, Proceedings of the 7th International Symposium on Quality Electronic Design (ISQED '06), 0-7695-2523-7/06; 6 pages.

* cited by examiner

*Primary Examiner* — Benjamin P Sandvik
*Assistant Examiner* — Krista Soderholm
(74) *Attorney, Agent, or Firm* — Schmeiser, Olsen & Watts; David Cain

(57) ABSTRACT

An integrated circuit including a first wire of a first level of wiring tracks, a second wire of a second level of wiring tracks, a third wire of a third level of wiring tracks, and a fourth wire located a first distance from the second wire in the second level of wiring tracks. A first via connects the first and second wires at a first location of the second wire. A second via connects the second and third wires at the first location, the second via is substantially axially aligned with the first via. A third via connecting the third and fourth wires at a second location of the fourth wire. A fourth via connecting the first and fourth wires at the second location, the fourth via is substantially axially aligned with the third via. The second, third, and fourth vias, and the third and Fourth wires form a path between the first and second wires redundant to the first via.

20 Claims, 9 Drawing Sheets

REDUNDANT MICRO-LOOP STRUCTURE FOR USE IN AN INTEGRATED CIRCUIT PHYSICAL DESIGN PROCESS AND METHOD OF FORMING THE SAME

This application is a continuation of copending U.S. patent application Ser. No. 11/552,225 filed on Oct. 24, 2006.

FIELD OF THE INVENTION

The present invention generally relates to the field of integrated circuit physical design. In particular, the present invention is directed to a redundant micro-loop structure for use in an integrated circuit physical design process and method of forming the same.

BACKGROUND

As the physical dimensions of very large scale integrated circuits (VLSI) continue to shrink, it has become increasingly difficult to manufacture such integrated circuits in a reliable fashion. The sensitivity of a VLSI design to random defects increases as feature widths and spacing between features grow smaller. In addition, the presence of single vias (i.e., inter-layer connectors through a single via) is particularly undesirable. From the perspective of random-defect yield, a single via is especially likely to cause a chip failure because a spot-defect landing on a single via will create an open circuit. From the perspective of systematic yield, if vias are difficult to manufacture in a given process, a poorly created single via can cause a circuit open or a highly resistive connection, which can cause a circuit to fail. New manufacturing processes are particularly sensitive to yield problems that are related to the formation of vias. An example of a single via structure is shown with reference to FIGS. 1A and 1B.

For these reasons, a need exists for improved structures for implementing redundant vias in an integrated circuit physical design process, in order to reduce the complexity of the manufacturing process, maintain high wiring density, and maximize manufacturing yield.

SUMMARY OF THE DISCLOSURE

In one embodiment an integrated circuit is disclosed. The integrated circuit includes a first wire of a first level of wiring tracks; a second wire of a second level of wiring tracks, the second level being adjacent the first level; a first via connecting the first and second wires at a first location of the second wire; a third wire of a third level of wiring tracks, the third level being adjacent the second level; a second via connecting the second and third wires at the first location, the second via being substantially axially aligned with the first via; a fourth wire located a first distance from the second wire in the second level; a third via connecting the third and fourth wires at a second location of the fourth wire; and a fourth via connecting the first and fourth wires at the second location, the fourth via being substantially axially aligned with the third via; wherein the second, third, and fourth vias, and the third and fourth wires form a path between the first and second wires redundant to the first via.

In another embodiment another integrated circuit is disclosed. The integrated circuit includes a first wire of a first level of wiring tracks; a second wire of a second level of wiring tracks, the second level being adjacent the first level; a third wire of a third level of wiring tracks, the third level being adjacent the second level, the third wire being aligned vertically and running substantially parallel with the first wire; a first via connecting the first and second wires; a second via connecting the third wire to the second wire; a fourth wire located a first distance from the second wire in the second level; a third via connecting the third wire and the fourth wire; a fourth via connecting the first wire to the fourth wire, wherein the second, third, and fourth vias provide a path between the first and second wires that is redundant to the first via.

In yet another embodiment a method for designing an integrated circuit having a first wire of a first level of wiring tracks connected to a second wire of a second level of wiring tracks with redundant paths is disclosed. The method includes positioning a first via between the first and second wires at a first location of the second wire for connecting the first and second wires; positioning a third wire in a third level of wiring tracks adjacent the second level, the third wire being aligned vertically and substantially parallel with the first wire; positioning a second via between the second and third wires at the first location for connecting the second and third wires, the second via being substantially axially aligned with the first via; positioning a fourth wire at a first distance from the second wire in the second level; positioning a third via between the third and fourth wires for connecting the third and fourth wires; and positioning a fourth via between the first and fourth wires for connecting the first and fourth wires, the fourth via being substantially axially aligned with the third via.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1A:
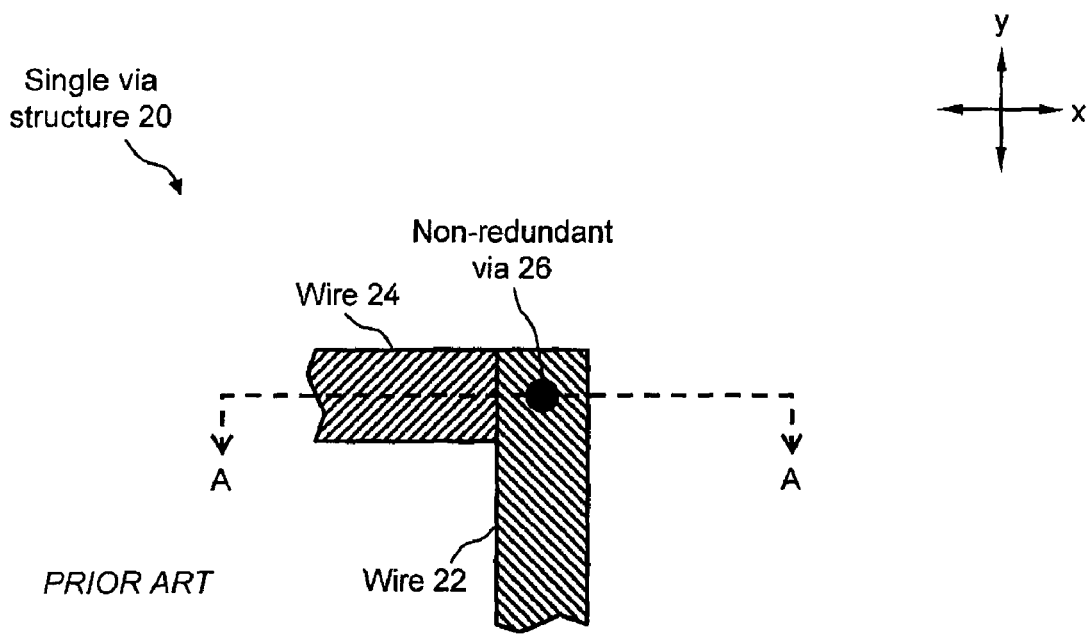
FIG. 1A illustrates a top view of a single via structure, which is a structure that is commonly found in integrated circuit design.
Figure 1B:
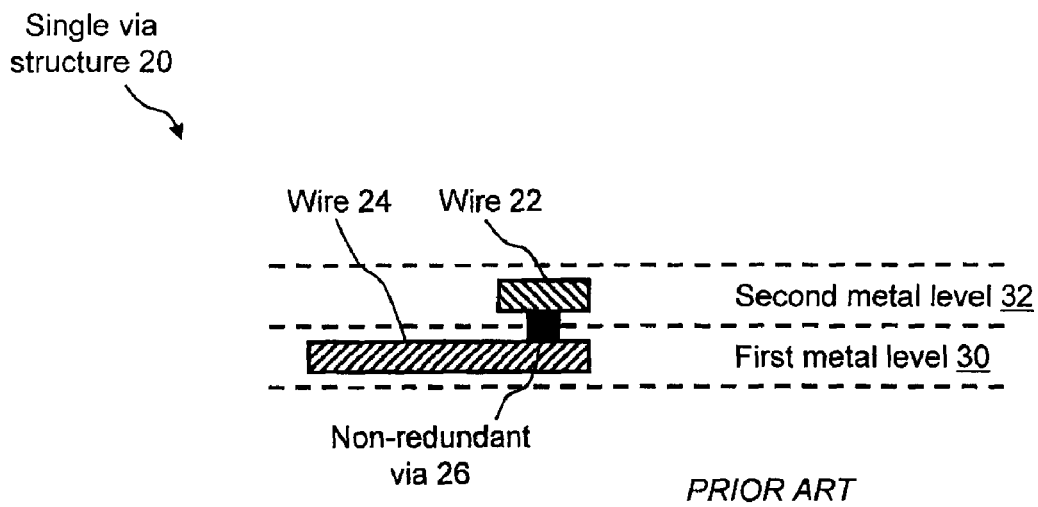
FIG. 1B illustrates a cross-sectional view of the single via structure, taken along line AA of FIG. 1A.

Referring now to the figures, FIG. 1A illustrates a top view of a single via structure 20. FIG. 1B illustrates a cross-sectional view of single via structure 20, taken along line AA of FIG. 1A. Single via structure 20 is formed of a wire 22 and a wire 24 that are arranged orthogonal to one another on a first level 30 and a second level 32, respectively. For example, wire 22 runs in a y-direction and wire 24 runs in an x-direction. Additionally, one end of wire 22 is electrically connected to one end of wire 24 by use of a non-redundant via 26, which is metal that spans the vertical distance between first level 30 and second level 32, as shown in FIG. 1B. Non-redundant via 26 is a standard via, which is a single via between adjacent wiring levels.

A technique for increasing the quality of via connections in a VLSI layout is the addition of redundant vias, either as part of the routing step or as a separate post-routing step. An example of a redundant via structure is shown with reference to FIGS. 2A and 2B.

Figure 2A:
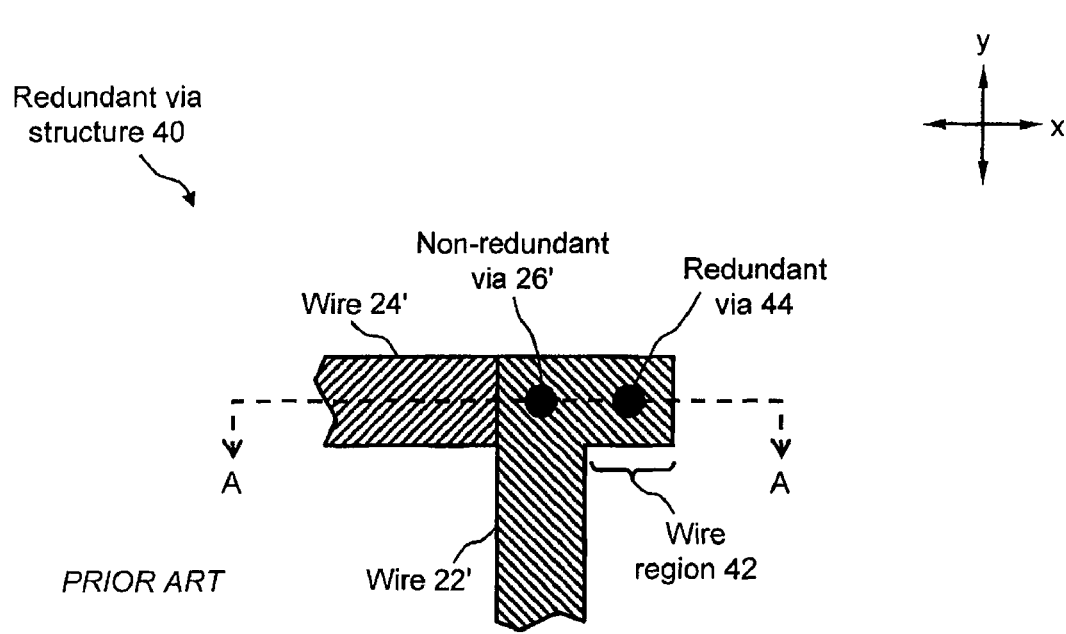
FIG. 2A illustrates a top view of a redundant via structure, which is a structure that is found in integrated circuit design.
Figure 2B:
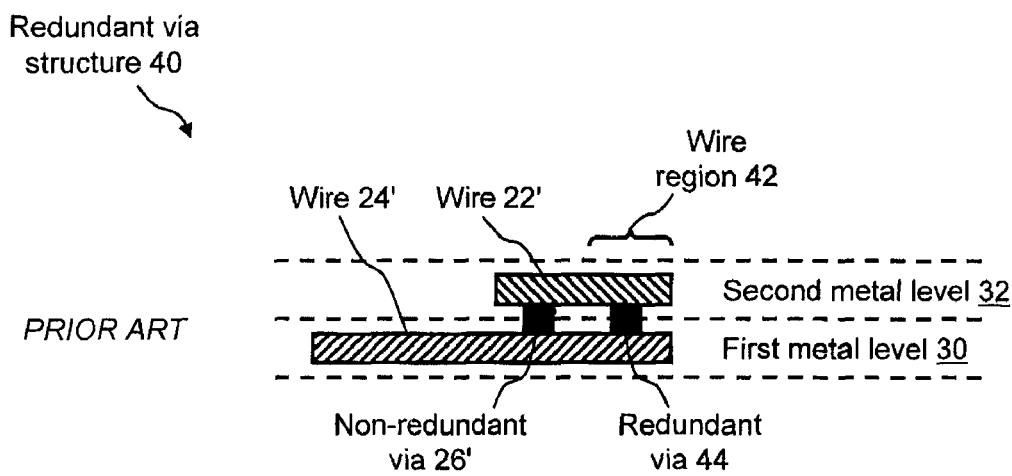
FIG. 2B illustrates a cross-sectional view of the redundant via structure, taken along line AA of FIG. 2A.

FIG. 2A illustrates a top view of a redundant via structure 40. FIG. 2B illustrates a cross-sectional view of redundant via structure 40, taken along line AA of FIG. 2A. Redundant via structure 40 is formed of a wire 22' and a wire 24' that are arranged orthogonal to one another on first level 30 and second level 32, respectively. For example, wire 22' runs in a y-direction and wire 24' runs in an x-direction. Additionally, wire 22' is electrically connected to wire 24' by use of a non-redundant via 26', which is metal that spans the vertical distance between first level 30 and second level 32, as shown in FIG. 2B. Wire 22', wire 24', and non-redundant via 26' are substantially identical to wire 22, wire 24, and non-redundant via 26, respectively, of single via structure 20 of FIGS. 1A and 1B. However, wire 22' and wire 24' of redundant via structure 40 further include a wire region 42 within which is placed a redundant via 44.

In the case of wire 24', wire region 42 is metal that is added to wire 22' in order to extend its length. However, in the case of wire 22', wire region 42 of wire 22' is additional metal that is added to wire 22' in an L shape, i.e., wire region 42 is added in the x-direction, while wire 22' is running in the y-direction. This is known to those skilled in the art as wrong-way wiring. Furthermore, wire 22' is electrically connected to wire 24' by use of redundant via 44, which, like non-redundant via 26', is metal that spans the vertical distance between first level 30 and second level 32. As a result, redundant via structure 40 includes two electrical connections between wire 22' and wire 24', as shown in FIG. 2B. In particular, redundant via 44 is a via that is adjacent to a standard via (e.g., non-redundant via 26') and that uses wrong-way wiring. In doing so, if there is a defect in non-redundant via 26', the electrical connection between wire 22' and wire 24' is maintained by use of redundant via 44.

However, certain drawbacks are present with the use of redundant vias, as described with reference to redundant via structure 40 of FIGS. 2A and 2B. For example, wrong-way wiring adds complexity to the integrated circuit manufacturing process and is, thus, not a desired practice. Sharp corners of an L-shaped wire (e.g., wire 22') are more difficult to manufacture, as corners are harder to image and etch. Additionally, the practice of wrong-way wiring consumes wiring tracks and, thus, wiring density is lost. Additionally, the geometry of non-straight wires tend to become misshapen and, thus, additional assist features are added, which adds complexity to the design. Furthermore, the lithography process that is used in the integrated circuit manufacturing process is falling behind the trend toward smaller and smaller chip technologies. As a result, the use of wrong-way wiring to form redundant vias is becoming more and more limited.

Figure 3A:
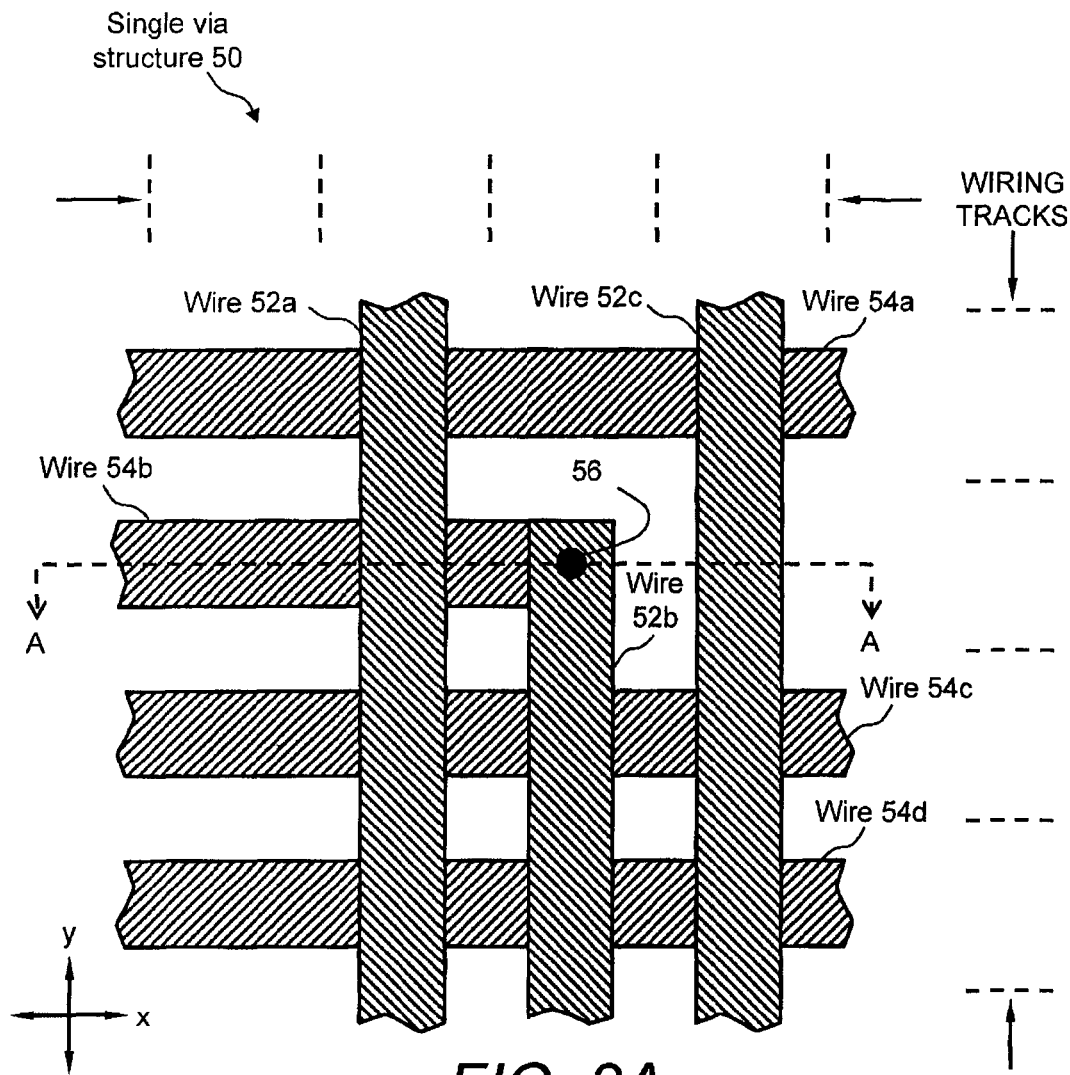
FIG. 3A illustrates a top view of a single via structure, which is a structure that is found in integrated circuit design.
Figure 3B:
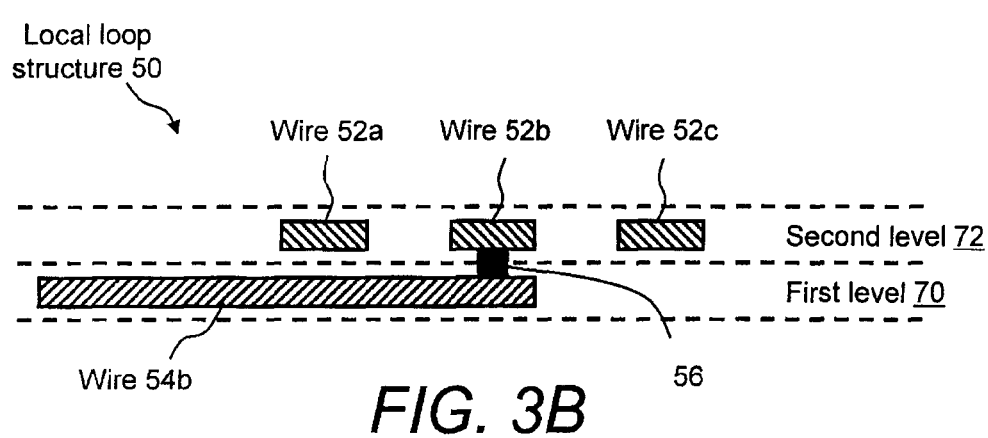
FIG. 3B illustrates a cross-sectional view of the single via structure, taken along line AA of FIG. 3A.

FIG. 3A illustrates a top view of a single via structure 50. FIG. 3B illustrates a cross-sectional view of single via structure 50, taken along line AA of FIG. 3A. Single via structure 50 is formed of a set of wires 52 (e.g., a wire 52a, 52b, and 52c) and a set of wires 54 (e.g., a wire 54a, 54b, 54c, and 52d). Wires 52 and wires 54 are arranged orthogonal to one another on a first level 70 and a second level 72, respectively. For example, wires 52 are arranged parallel to one another within a set of wiring tracks that run in the y-direction. Similarly, wires 54 are arranged parallel to one another within a set of wiring tracks that run in the x-direction. Additionally, wire 52b is electrically connected to wire 54b by use of a first base via 56, which is generally metal that spans the vertical distance between first level 70 and second level 72, as shown in FIG. 3B. First base via 56 may be a standard via, which is a single via between adjacent wiring levels. An improved structure for providing redundant vias for first base via 56 is provided with reference to FIGS. 4A and 4B.

Figure 4A:
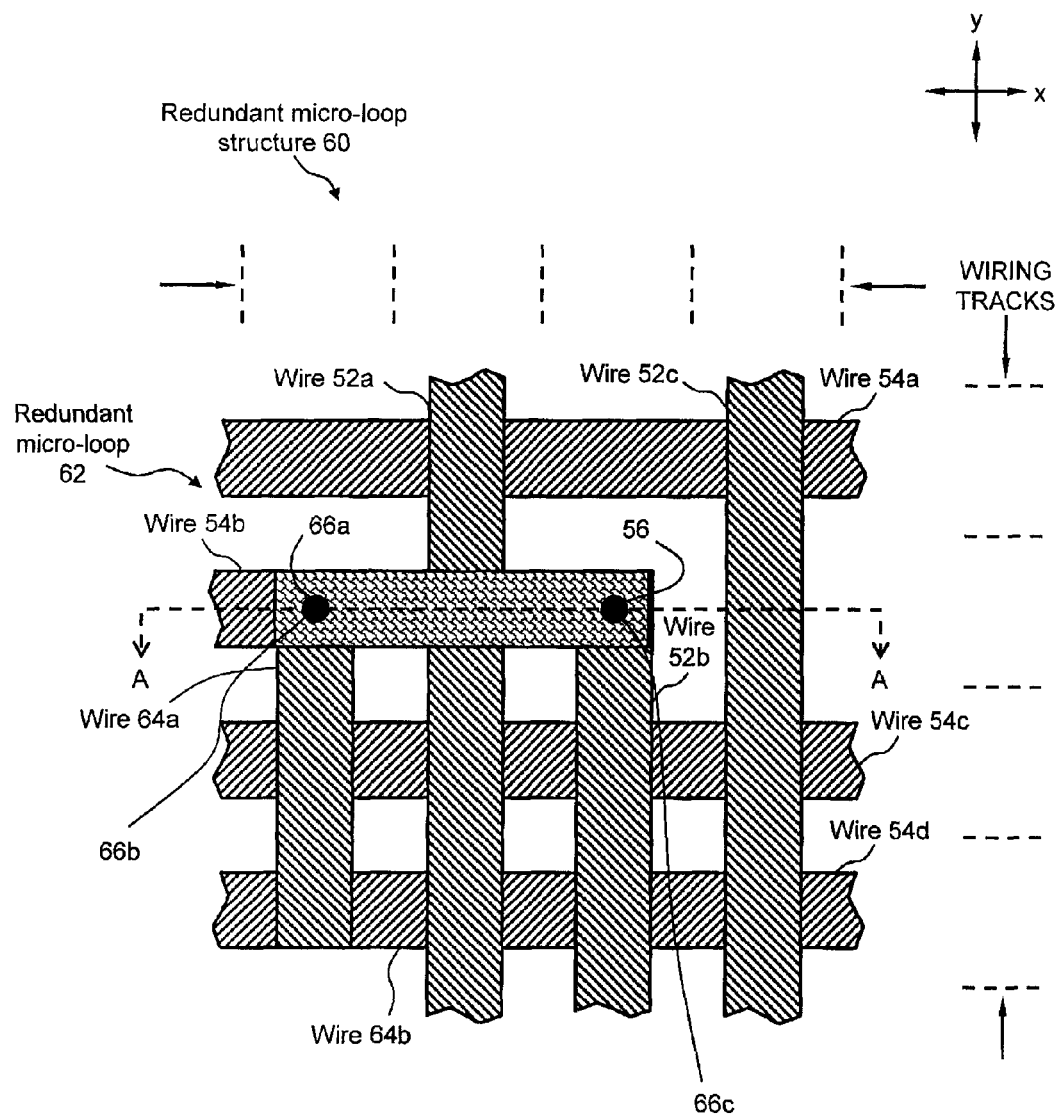
FIG. 4A illustrates a top view of a redundant micro-loop structure, in accordance with the disclosure.
Figure 4B:
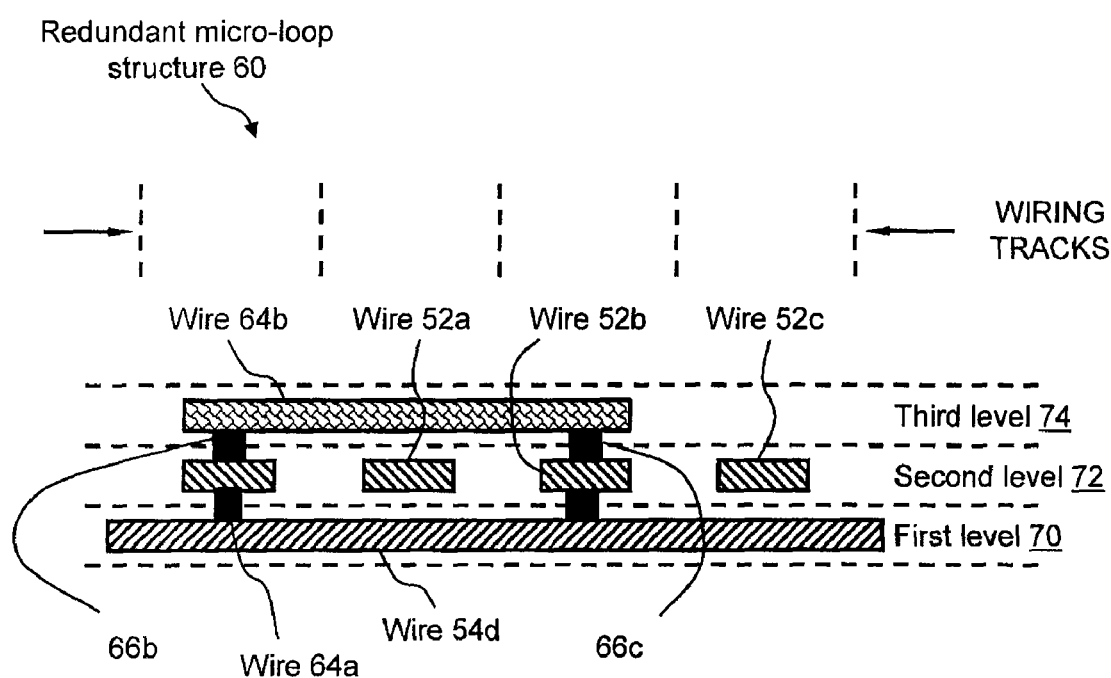
FIG. 4B illustrates a cross-sectional view of the redundant micro-loop structure, taken along line AA of FIG. 4A.

FIG. 4A illustrates a top view of a redundant micro-loop structure 60, in accordance with the disclosure. FIG. 4B illustrates a cross-sectional view of redundant micro-loop structure 60, taken along line AA of FIG. 4A. Redundant micro-loop structure 60 of FIGS. 4A and 4B is single via structure 50 of FIGS. 3A and 3B that is modified to provide an improved structure for forming redundant vias that is an alternative to the use of redundant via structure 40 of FIGS. 2A and 2B. Redundant micro-loop structure 60 of FIGS. 4A and 4B provides redundant vias while eliminating wrong-way wiring and without diminishing wiring density.

With continuing reference to FIGS. 4A and 4B, redundant micro-loop structure 60 includes wires 52 and wires 54 that are arranged orthogonal to one another on first level 70 and second level 72, respectively, and first base via 56, as described with reference to single via structure 50 of FIGS. 3A and 3B. However, redundant micro-loop structure 60 further includes a redundant micro-loop 62, which is an example of a redundant local loop that is in close proximity, for example within a range of about two to about ten wiring tracks, to first base via 56 and that may be formed by use of at least one level in addition to two existing levels in combination with three additional vias. In other words, a standard, non-redundant via structure includes an electrical path from (1) a given level (MX) to MX plus 1 (MX+1) or (2) MX to MX minus 1 (MX−1). By contrast, the redundant micro-loop structure of the present disclosure includes an electrical path, for example, from (1) MX to MX+1 to MX to MX−1, (2) MX to MX−1 to MX minus 2 (MX−2) to MX−1, or (3) MX to MX+1 to MX plus 2 (MX+2) to MX+1. It should also be noted that first, second, and third levels may include metals levels or layers or similar materials used in integrated chips while keeping within the scope and spirit of the present disclosure.

In the example shown in FIGS. 4A and 4B, redundant micro-loop 62 of redundant micro-loop structure 60 may be formed of wires 64 (e.g., a wire 64a and 64b) and multiple vias 66 (e.g., a second via 66a, a third via 66b, and a fourth via 66c). In one example, redundant micro-loop 62 may be formed of wire 64a that is placed within a range of about two to about ten wiring tracks away from wire 52b on second level 72 (see FIGS. 4A and 4B) and wire 64b that is placed on a third level 74 and in the same wiring track as wire 54b, which is at first level 70 (see FIGS. 4A and 4B) and, thus, wire 64b may be aligned vertically and runs substantially parallel with wire 54b. Moreover, wire 64b may have a variable length with a minimum length from approximately at third via 66b to approximately at fourth via 66c. Additionally, wire 52b may also have a variable length with a minimum length ruiming across first base via 56. Wire 64a is electrically connected to wire 54b by use of second via 66a. Wire 64a may also be electrically connected to wire 64b by use of third via 66b. Third via 66b may be axially aligned substantially directly with second via 66a in the x- or y-dimension and, thus, form a first set of "stacked" vias. Additionally, wire 64b may be electrically connected to wire 52b by use of fourth via 66c. Fourth via 66c may be axially aligned substantially directly with first base via 56 in the x- or y-dimension and, thus, form another set of "stacked" vias. As a result, the combination of wire 64a and wire 64b provides an alternative electrical path between wire 52b and wire 54b in the event that first base via 56 is defective (i.e., open or highly resistive). In another example, the formation of redundant micro-loop 62 may not include wrong-way wiring.

Redundant micro-loop structure 60 is not limited to the example of redundant micro-loop 62, as shown in FIGS. 4A and 4B. Alternatively, wire 64a, wire 52b, wire 64b, and wire 54b may be place according to (1) MX to MX+1 to MX to MX−1, (2) MX to MX−1 to MX minus 2 (MX−2) to MX−1, or (3) MX to MX+1 to MX plus 2 (MX+2) to MX+1.

Figure 5:
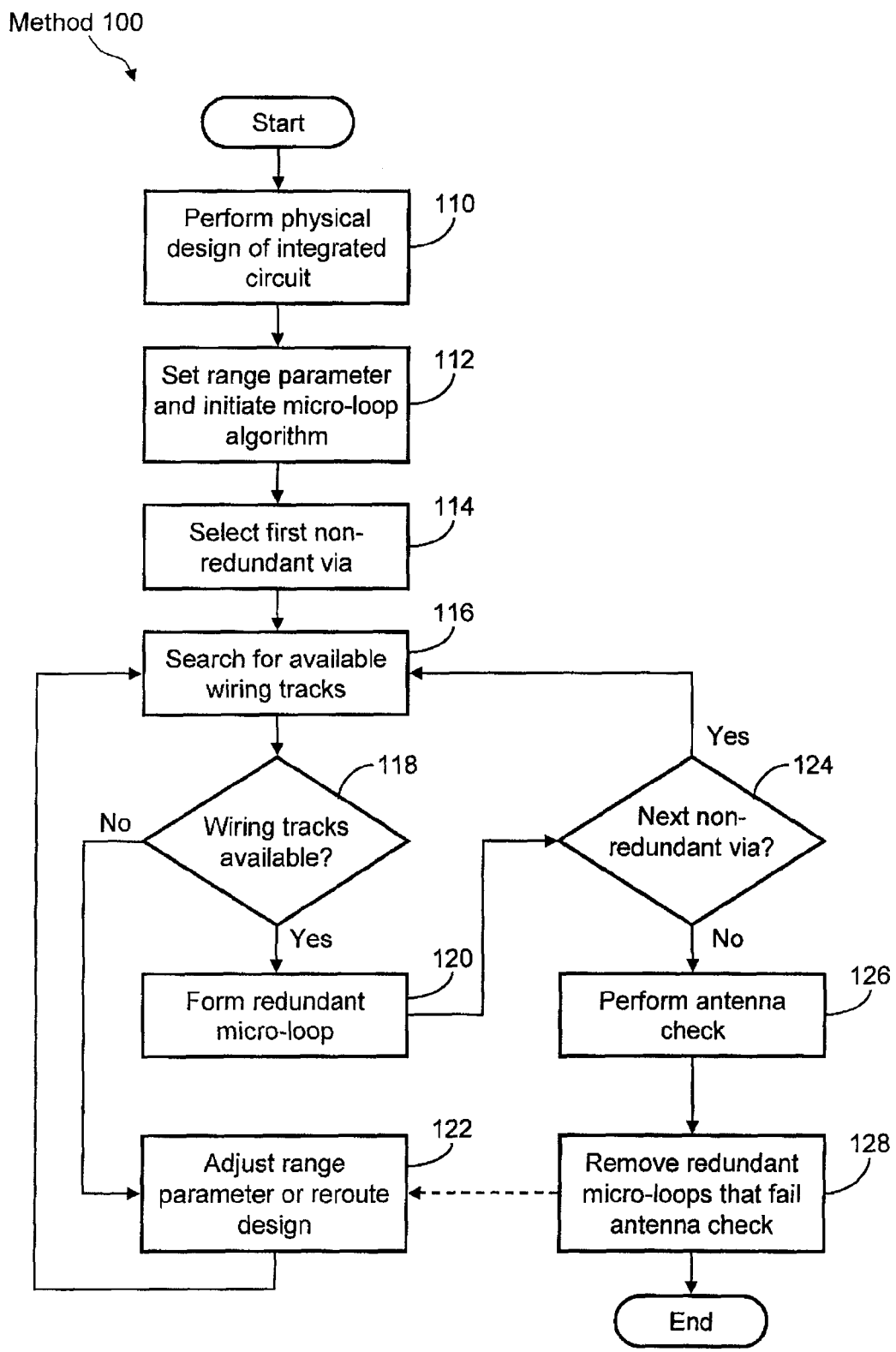
FIG. 5 illustrates a method of forming redundant micro-loop structures in an integrated circuit physical design process, in accordance with the disclosure.

FIG. 5 illustrates a method 100 of forming redundant micro-loop structures in an integrated circuit physical design process. The placement of wires within an integrated circuit physical design process is the result of a standard logic synthesis operation that is facilitated by any commercially available electronic design automation (EDA) tool, such as provided by CADENCE® Design Systems, Inc. (San Jose, Calif.), which performs standard place and route operations that are associated with an integrated circuit physical design process. The formation of redundant micro-loop structures, such as redundant micro-loop structure 60, is an iterative process that is performed by a "micro-loop algorithun" that is executed within any standard EDA tool, such as the CADENCE application. The functions of the micro-loop algorithm for forming redundant micro-loop structures are reflected in method 100, which includes, but is not limited to, the following steps.

At step 110, the physical design of an integrated circuit may be performed by use of any standard EDA tool, such as the CADENCE application, which performs standard place and route operations that are associated with an integrated circuit physical design process. In doing so, an arrangement of wires on multiple levels is formed, such as, but not limited to, those shown in single via structure 50 of FIGS. 3A and 3B and redundant micro-loop structure 60 of FIGS. 4A and 4B.

At step 112, the micro-loop algorithm may be initiated by the a circuit designer or the EDA application and a first base via, such as first base via 56 of redundant micro-loop structure 60, is selected as the first base via of interest by the micro-loop algorithm.

At step 114, the micro-loop algorithm searches for available wiring tracks at levels other than, but substantially parallel to, the level at which the first base via of interest resides. For example and referring again to FIGS. 4A and 4B, the micro-loop algorithm searches for available wiring tracks at second level 72 and/or third level 74, which are substantially parallel to first level 70, which may be the level at which first base via 56 resides. It is beneficial that the alternative wiring path be as short as possible, e.g. from about zero to five wiring tracks, in order to leave enough wiring resources for other redundant micro-loops to be added later, and to minimize the risk of short defects in the newly added wiring.

At decision step 116, based on the results of step 114, the micro-loop algorithm determines whether sufficient wiring tracks to form a redundant micro-loop for the first base via of interest are located. If yes, method 100 proceeds to step 118. If no, method 100 proceeds to step 120.

At step 118, under the control of the micro-loop algorithm, a redundant micro-loop may be formed. For example, in the case of redundant micro-loop structure 60, redundant micro-loop 62 may be formed by:

1. positioning first base via 56 between wire 54b and wire 52b at a first location for electrically connecting wire 54b and wire 52b;
2. positioning wire 64b at third level 74, which may be adjacent to second level 72. Additionally, wire 64b may be aligned vertically and substantially parallel with wire 54b;
3. positioning fourth via 66c between wire 52b and wire 64b at the first location for electrically connecting wire 52b and wire 64b. Additionally, fourth via 66c may be substantially axially aligned with first base via 56;
4. positioning wire 64a at a first distance from wire 52b at second level 72;
5. positioning third via 66b between wire 64b and wire 64a at a second location for electrically connecting wire 64b and wire 64a; and
6. positioning second via 66a between wire 54b and wire 64a at a second location for electrically connecting wire 54b and wire 64a, second via 66a being substantially axially aligned with third via 66b. In doing so, a path is provided between wire 54b and wire 52b that is redundant to first base via 56, by use of second via 66a, third via 66b, and fourth via 66c. Method 100 proceeds to step 120.

At decision step 120, the micro-loop algorithm determines whether there is at least one first base via that is not yet processed. If yes, the micro-loop algorithm selects the next first base via to process and method 100 returns to step 114. If no, method 100 proceeds to step 122.

At step 122, because wiring loops can create an antenna effect, which is not desirable because an antenna may create charging problems and/or electro-migration problems, an "antenna check" may be performed on any or all redundant micro-loops that are formed by method 100. The antenna check may be a standard verification operation of any EDA application.

At step 124, under the control of the EDA application or the micro-loop algorithm, all redundant micro-loops that violate the antenna check may be removed from the integrated circuit design. Method 100 ends. Optionally, method 100 may return to step 112 and additional iterations of method 100 are executed.

It is to be noted that the aspects and embodiments described herein may be conveniently implemented using a machine (e.g., a general purpose computing device) programmed according to the teachings of the present specification, as will be apparent to those skilled in the computer art. Appropriate software coding can readily be prepared by skilled programmers based on the teachings of the present disclosure, as will be apparent to those skilled in the software art.

Such software may be a computer program product that employs a machine-readable medium. A machine-readable medium may be any medium that is capable of storing and/or encoding a sequence of instructions for execution by a machine (e.g., a general purpose computing device) and that causes the machine to perform any one of the methodologies and/or embodiments described herein. Examples of a machine-readable medium include, but are not limited to, a magnetic disk (e.g., a conventional floppy disk, a hard drive disk), an optical disk (e.g., a compact disk "CD", such as a readable, writeable, and/or re-writable CD; a digital video disk "DVD", such as a readable, writeable, and/or rewritable DVD), a magneto-optical disk, a read-only memory "ROM"

device, a random access memory "RAM" device, a magnetic card, an optical card, a solid-state memory device (e.g., a flash memory), an EPROM, an EEPROM, and any combinations thereof. A machine-readable medium, as used herein, is intended to include a single medium as well as a collection of physically separate media, such as, for example, a collection of compact disks or one or more hard disk drives in combination with a computer memory.

Examples of a general purpose computing device include, but are not limited to, a computer workstation, a terminal computer, a server computer, a handheld device (e.g., tablet computer, a personal digital assistant "PDA", a mobile telephone, etc.), a web appliance, a network router, a network switch, a network bridge, any machine capable of executing a sequence of instructions that specify an action to be taken by that machine, and any combinations thereof. In one example, a general purpose computing device may include and/or be included in, a kiosk.

Figure 6:
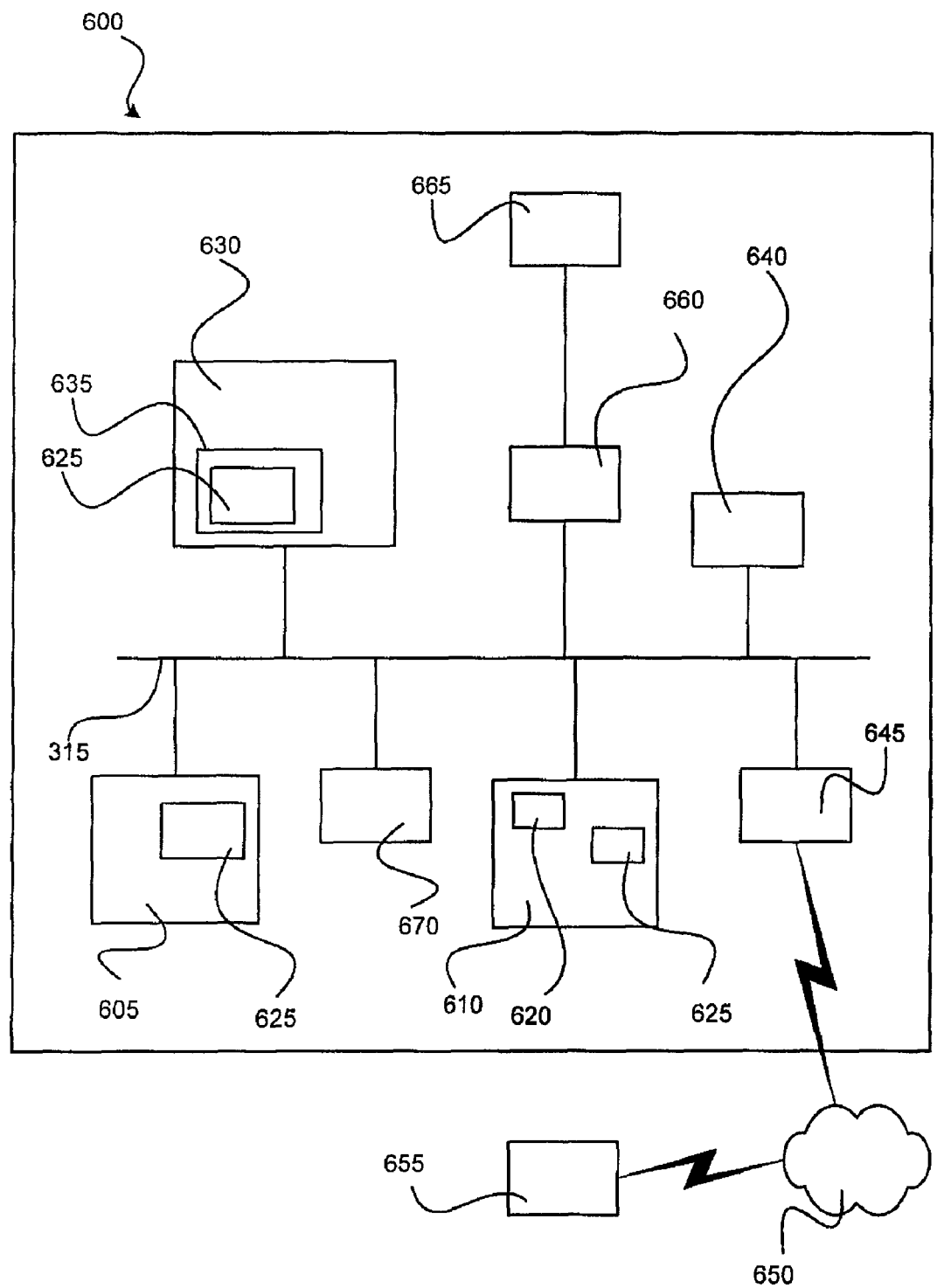
FIG. 6 illustrates one example of a general purpose computing environment.

FIG. 6 shows a diagrammatic representation of one embodiment of a general purpose computing device in the exemplary form of a computer system 600 within which a set of instructions for causing the device to perform any one or more of the aspects and/or methodologies of the present disclosure may be executed. Computer system 600 includes a processor 605 and a memory 610 that communicate with each other, and with other components, via a bus 615. Bus 615 may include any of several types of bus structures including, but not limited to, a memory bus, a memory controller, a peripheral bus, a local bus, and any combinations thereof, using any of a variety of bus architectures.

Memory 610 may include various components (e.g., machine readable media) including, but not limited to, a random access memory component (e.g., a static RAM "SRAM", a dynamic RAM "DRAM", etc.), a read only component, and any combinations thereof. In one example, a basic input/output system 620 (BIOS), including basic routines that help to transfer information between elements within computer system 600, such as during start-up, may be stored in memory 610. Memory 610 may also include (e.g., stored on one or more machine-readable media) instructions (e.g., software) 625 embodying any one or more of the aspects and/or methodologies of the present disclosure. In another example, memory 610 may further include any number of program modules including, but not limited to, an operating system, one or more application programs, other program modules, program data, and any combinations thereof.

Computer system 600 may also include a storage device 630. Examples of a storage device (e.g., storage device 630) include, but are not limited to, a hard disk drive for reading from and/or writing to a hard disk, a magnetic disk drive for reading from and/or writing to a removable magnetic disk, an optical disk drive for reading from and/or writing to an optical media (e.g., a CD, a DVD, etc.), a solid-state memory device, and any combinations thereof. Storage device 630 may be connected to bus 615 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 630 may be removably interfaced with computer system 600 (e.g., via an external port connector (not shown)). Particularly, storage device 630 and an associated machine-readable medium 635 may provide nonvolatile and/or volatile storage of machine-readable instructions, data structures, program modules, and/or other data for computer system 600. In one example, software 625 may reside, completely or partially, within machine-readable medium 635. In another example, software 625 may reside, completely or partially, within processor 605.

Computer system 600 may also include an input device 640. In one example, a user of computer system 600 may enter commands and/or other information into computer system 600 via input device 640. Examples of an input device 640 include, but are not limited to, an alpha-numeric input device (e.g., a keyboard), a pointing device, a joystick, a game pad, an audio input device (e.g., a microphone, a voice response system, etc.), a cursor control device (e.g., a mouse), a touchpad, an optical scanner, a video capture device (e.g., a still camera, a video camera), touch screen, and any combinations thereof. Input device 640 may be interfaced to bus 615 via any of a variety of interfaces (not shown) including, but not limited to, a serial interface, a parallel interface, a game port, a USB interface, a FIREWIRE interface, a direct interface to bus 615, and any combinations thereof.

A user may also input commands and/or other information to computer system 600 via storage device 630 (e.g., a removable disk drive, a flash drive, etc.) and/or a network interface device 645. A network interface device, such as network interface device 645 may be utilized for connecting computer system 600 to one or more of a variety of networks, such as network 650, and one or more remote devices 655 connected thereto. Examples of a network interface device include, but are not limited to, a network interface card, a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a direct connection between two computing devices, and any combinations thereof. A network, such as network 650, may employ a wired and/or a wireless mode of communication. In general, any network topology may be used. Information (e.g., data, software 625, etc.) may be communicated to and/or from computer system 600 via network interface device 645.

Computer system 600 may further include a video display adapter 660 for communicating a displayable image to a display device, such as display device 665. Examples of a display device include, but are not limited to, a liquid crystal display (LCD), a cathode ray tube (CRT), a plasma display, and any combinations thereof. In addition to a display device, a computer system 600 may include one or more other peripheral output devices including, but not limited to, an audio speaker, a printer, and any combinations thereof. Such peripheral output devices may be connected to bus 615 via a peripheral interface 670. Examples of a peripheral interface include, but are not limited to, a serial port, a USB connection, a FIREWIRE connection, a parallel connection, and any combinations thereof.

A digitizer (not shown) and an accompanying pen/stylus, if needed, may be included in order to digitally capture freehand input. A pen digitizer may be separately configured or coextensive with a display area of display device 665. Accordingly, a digitizer may be integrated with display device 665, or may exist as a separate device overlaying or otherwise appended to display device 665.

In one example, a redundant micro-loop, such as redundant micro-loop 62 of redundant micro-loop structure 60, in the vicinity of single, non-redundant vias may increase the robustness to via opens and to high resistance vias and may considerably increase the percentage of redundant vias compared with previous approaches. Furthermore, redundant micro-loops are much more flexible in layout and are less susceptible to small defects than standard redundant vias, such as shown in redundant via structure 40 of FIGS. 2A and 2B. A redundant micro-loop does not require wrong-way wiring. Each redundant micro-loop structure uses at least one level in addition to two existing levels in combination with three additional vias.

Figure 7A:
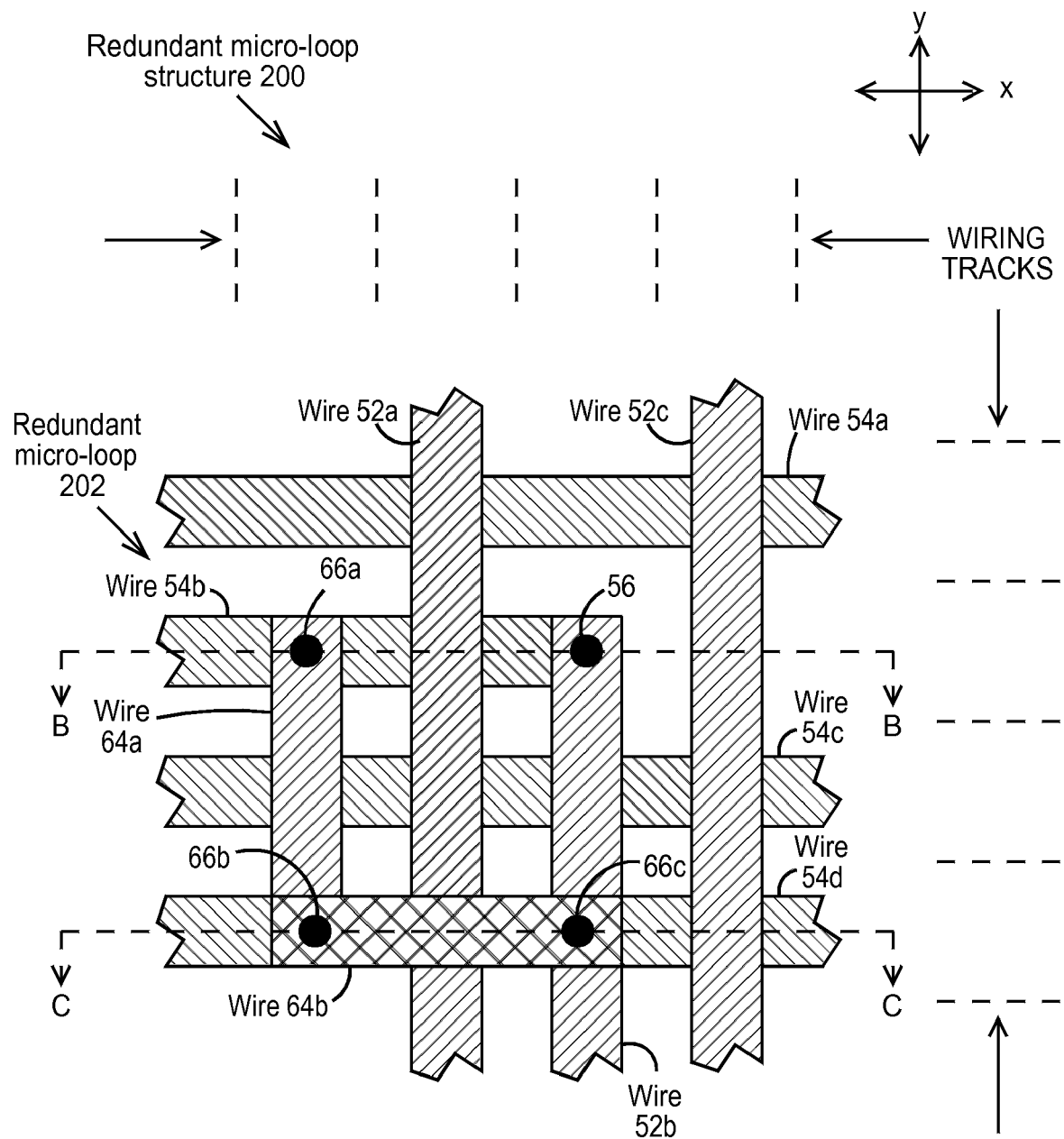
FIG. 7A illustrates a top view of a variation of the redundant micro-loop structure of FIGS. 4A and 4B, in accordance with the disclosure.
Figure 7B:
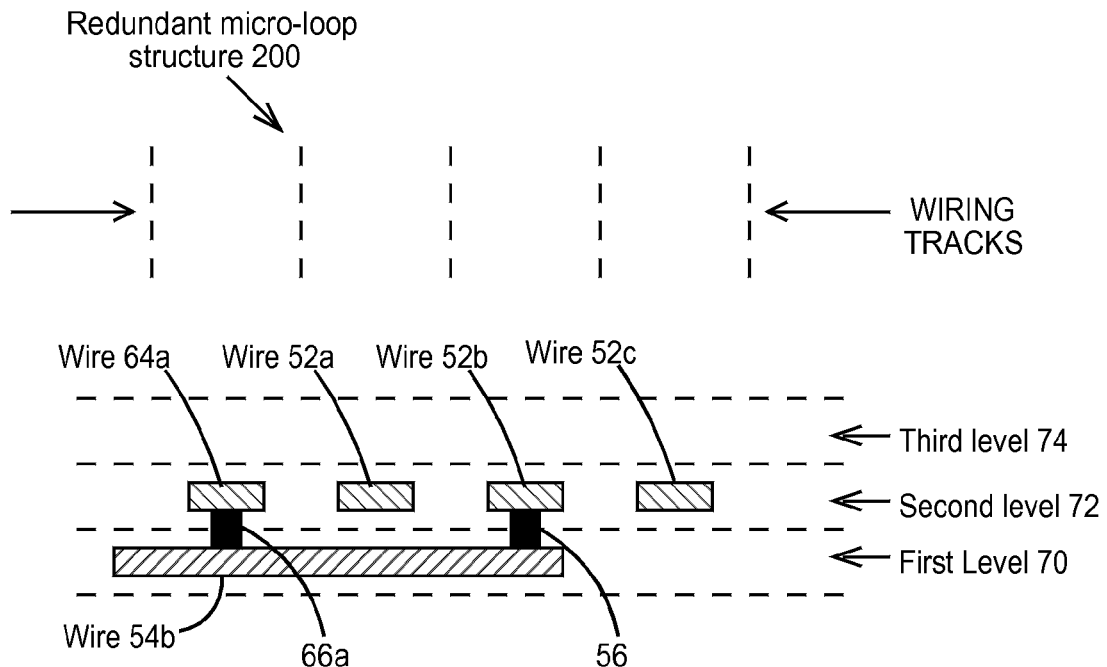
FIG. 7B illustrates a cross-sectional view of the redundant micro-loop structure, taken along line BB of FIG. 7A.
Figure 7C:
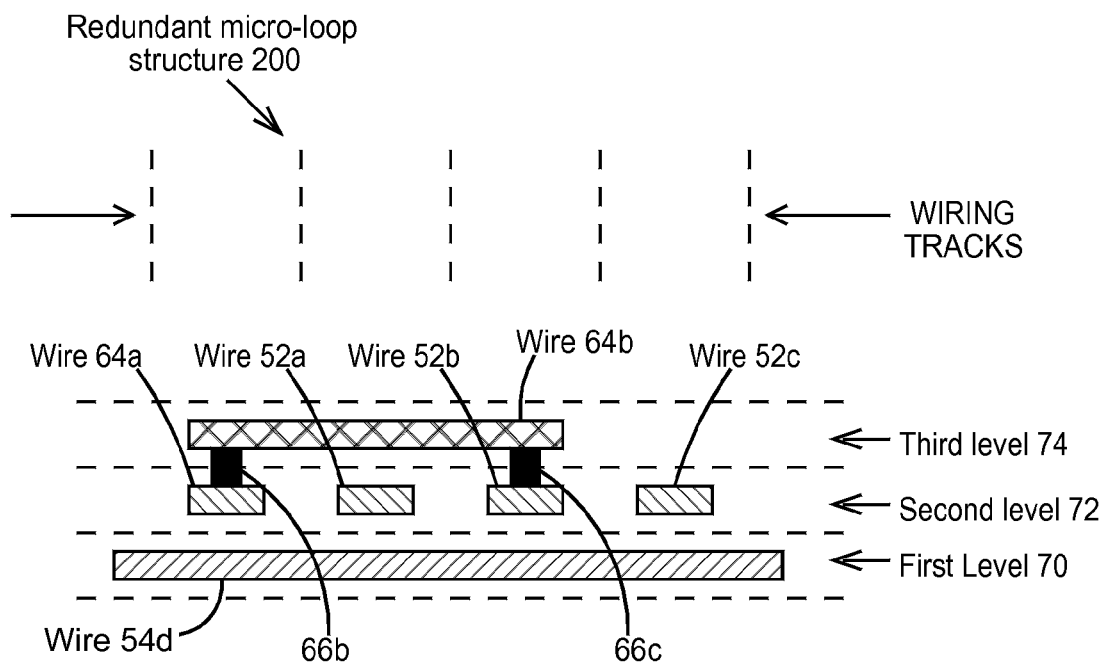
FIG. 7C illustrates a cross-sectional view of the redundant micro-loop structure, taken along line CC of FIG. 7A.

FIG. 7A illustrates a top view of a variation of the redundant micro-loop structure of FIGS. 4A and 4B, in accordance with the disclosure a first wire of a first level of wiring tracks, FIG. 7B illustrates a cross-sectional view of the redundant micro-loop structure, taken along line BB of FIG. 7A, and FIG. 7C illustrates a cross-sectional view of the redundant micro-loop structure, taken along line CC of FIG. 7A. In FIGS. 7A, 7B and 7C, a redundant micro-loop 200 includes a first wire 54b of a first level of wiring tracks 70, a second wire 52b of a second level of wiring tracks 72 (the second level of wiring tracks 72 being adjacent said first level of wiring tracks 70), a third wire 64b of a third level of wiring tracks 74 (the third level of wiring tracks 74 being adjacent to the second level of wiring tracks 72 and the third wire 64b being aligned vertically and running substantially parallel with the first wire; 54b), a first via 56 connecting the first wire 54b and second wire 52b, a second via 66c connecting the third wire 64b to the second wire 52b, a fourth wire 64a (located a first distance from the second wire 52b in the second level wiring level 72), a third via 66b connecting the third wire 64b and the fourth wire 64a, a fourth via 66a connecting the first wire 54b to the fourth wire 64a, wherein the second, third, and fourth vias 66a, 66b and 66c provide a path between the first wire 54b and the second wire 52b that is redundant to the first via 56.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An integrated circuit comprising:
   a first wire in a first level of wiring tracks;
   a second wire in a second level of wiring tracks, said second wire perpendicular to said first wire;
   a third wire in a third level of wiring tracks, said third wire parallel to and directly above said first wire;
   a fourth wire in said second level of wiring tracks, said second level of wiring tracks between said first and third level of wiring tracks;
   a first via between and connecting said first and second wires;
   a second via between and connecting said second and third wires, said second via aligned directly over said first via;
   a third via between and connecting said third and fourth wires; and
   a fourth via between and connecting said first and fourth wires, said fourth via aligned directly over said third via.

2. The integrated circuit of claim 1, wherein said second, third, and fourth vias, and said third and fourth wires form an electrically conductive path between said first and second wires redundant to a path through said first via.

3. The integrated circuit of claim 1, wherein said fourth wire is within a range of about 2 to about 10 wiring tracks of said second wire.

4. The integrated circuit of claim 1, wherein said third wire includes a first end and an opposite second end, said second via proximate to said first end and said third via proximate to said second end.

5. The integrated circuit of claim 1, further including:
   an additional wire in said second level of wiring tracks and between said second and fourth wires, said additional wire parallel to said second wire.

6. An integrated circuit comprising:
   a first wire in a first level of wiring tracks;
   a second wire in a second level of wiring tracks, said second wire perpendicular to said first wire;
   a third wire in a third level of wiring tracks, said third wire parallel to said first wire, said second level of wiring tracks between said first and second level of wiring tracks;
   a first via between and connecting said first wire to said second wire;
   a second via between and connecting said third wire to said second wire;
   a fourth wire in said second wiring level, said fourth wire parallel to said second wire;
   a third via between and connecting said third wire to said fourth wire; and
   a fourth via between and connecting said first wire to said fourth wire.

7. The integrated circuit of claim 6, wherein said second, third, and fourth vias and said third and fourth wires provide an electrically conductive path between said first and second wires redundant to a path through said first via.

8. The integrated circuit of claim 6, wherein said first and second vias are aligned to an axis that is parallel to a longitudinal axis of said first wire.

9. The integrated circuit of claim 6, wherein said third and fourth vias are aligned to an axis that is parallel to a longitudinal axis of said third wire.

10. The integrated circuit of claim 6, wherein said third wire includes a first end and an opposite second end, said second via proximate to said first end said third via proximate to said second end.

11. The integrated circuit of claim 6, wherein said fourth wire includes a first end and an opposite second end, said third via proximate to said first end said fourth via proximate to said second end.

12. A method for designing an integrated circuit having a first wire of a first level of wiring tracks connected by a first via to a second wire of a second level of wiring tracks with redundant paths comprising:
   positioning a third wire in a third level of wiring tracks, said third wire parallel to said first wire, said second level of wiring tracks between said first and second level of wiring tracks;
   positioning a second via between and connecting said third wire to said second wire;
   positioning a fourth wire in said second wiring level, said fourth wire parallel to said second wire;
   positioning a third via between and connecting said third wire to said fourth wire; and
   positioning a fourth via between and connecting said first wire to said fourth wire.

13. The method of claim 12, further comprising:
   forming a redundant electrical path between said first and second wires, said redundant path comprising said first, second, third, and fourth wires and said second, third, and fourth vias.

14. The method of claim 12, further comprising:
   setting a first distance between said first and second wires to be between about 2 to about 10 wiring tracks and setting a second distance between said first and third wires to be between about 2 to about 10 wiring tracks.

15. The method of claim 12, wherein the method is performed in a design model implementation in a general purpose computing device.

16. The method of claim 15, further comprising:
performing an antenna check on a path formed by said first, second, third and fourth wires and said first, second, third and fourth vias;
determining a violation path violating said antenna check; and
removing said violation path.

17. The method of claim 15, further comprising:
applying an electronic design automation application to the integrated circuit; and
rerouting said wires of said integrated circuit based on a resultant outcome of said electronic design automation application.

18. The method of claim 17, further comprising:
modifying available wires in close proximity to said first via based on said resultant outcome of said electronic design automation application.

19. The method of claim 12, further comprising:
repeating said method for forming redundant paths for a fifth wire and a sixth wire.

20. A computer readable medium containing computer executable instructions for designing an integrated circuit having a first wire of a first level of wiring tracks connected by a first via to a second wire of a second level of wiring tracks with redundant paths comprising according to claim 12, the instructions including:
a first set of instructions for positioning a second wire in a second level of wiring tracks, said second wire perpendicular to said first wire;
a second set of instructions for positioning a third wire in a third level of wiring tracks, said third wire parallel to said first wire, said second level of wiring tracks between said first and second level of wiring tracks;
a third set of instructions for positioning a first via between and connecting said first wire to said second wire;
a fourth set of instructions for positioning a second via between and connecting said third wire to said second wire;
a fifth set of instructions for positioning a fourth wire in said second wiring level, said fourth wire parallel to said second wire;
a sixth set of instructions for positioning a third via between and connecting said third wire to said fourth wire; and
a seventh set of instructions for positioning a fourth via between and connecting said first wire to said fourth wire.

* * * * *